United States Patent [19]

Chen et al.

[11] Patent Number: 5,423,940
[45] Date of Patent: Jun. 13, 1995

[54] SUPERSONIC MOLECULAR BEAM ETCHING OF SURFACES

[75] Inventors: Lee Chen, New York; Shwu-Jen Jeng, Fishkill; Wesley C. Natzle, Wappingers Falls; Chienfan Yu, Highland Mills, all of N.Y.

[73] Assignee: International Business Machines Corporation, Armonk, N.Y.

[21] Appl. No.: 114,710

[22] Filed: Aug. 31, 1993

Related U.S. Application Data

[63] Continuation of Ser. No. 786,448, Nov. 1, 1991, Pat. No. 5,286,331.

[51] Int. Cl.⁶ .............................................. H01J 21/00
[52] U.S. Cl. ...................... 216/66; 156/345; 427/565; 427/600
[58] Field of Search ............ 156/643, 345, 646; 118/715, 722; 427/600, 565

[56] References Cited

U.S. PATENT DOCUMENTS

| | | | |
|---|---|---|---|
| 4,734,158 | 3/1988 | Gillis | 156/345 |
| 4,740,267 | 4/1988 | Knauer et al. | 156/635 |
| 4,788,082 | 11/1988 | Schmitt | 427/255.2 |
| 4,917,123 | 4/1990 | McConnell et al. | 134/95 |
| 4,935,623 | 6/1990 | Knauer | 250/251 |
| 4,937,094 | 6/1990 | Doehler et al. | 437/38 |
| 4,942,057 | 7/1990 | Steinwandel et al. | 427/38 |
| 5,030,319 | 7/1991 | Nishino et al. | 156/646 |
| 5,104,634 | 4/1992 | Calcote | 204/192.15 |
| 5,108,535 | 4/1992 | Ono et al. | 156/345 |
| 5,108,778 | 4/1992 | Suzuki et al. | 427/595 |
| 5,271,800 | 12/1993 | Koontz et al. | 156/643 |
| 5,286,331 | 2/1994 | Chen et al. | 156/345 |

FOREIGN PATENT DOCUMENTS 9117285 11/1991 European Pat. Off. .
2301940 12/1990 Japan .

OTHER PUBLICATIONS

General Chemistry–Netergall et al; (c) 1976; Heath & Co., p. 160.
Ming L. Yu & Benjamin N. Eldridge, Real-Time Study of Oxygen on Si(100), Physical Review Letters, Apr. 20, 1987, pp. 1691–1694.
Nishino et al., Damage Free Selective Etching of Si Native Oxide Employing Fluorine Atoms & Nitrogen Hydrides Produced by NH3 & NF3 Microwave Discharge, 1989 Dry Process Symposium, pp. 90–93.

*Primary Examiner*—R. Bruce Breneman
*Assistant Examiner*—George Goudreau
*Attorney, Agent, or Firm*—Whitham, Curtis, Whitham & McGinn; Charles W. Peterson, Jr.

[57] ABSTRACT

In supersonic molecular beam etching, the reactivity of the etchant gas and substrate surface is improved by creating etchant gas molecules with high internal energies through chemical reactions of precursor molecules, forming clusters of etchant gas molecules in a reaction chamber, expanding the etchant gas molecules and clusters of etchant gas molecules through a nozzle into a vacuum, and directing the molecules and clusters of molecules onto a substrate. Translational energy of the molecules and clusters of molecules can be improved by seeding with inert gas molecules. The process provides improved controllability, surface purity, etch selectivity and anisotropy. Etchant molecules may also be expanded directly (without reaction in a chamber) to produce clusters whose translational energy can be increased through expansion with a seeding gas.

21 Claims, 3 Drawing Sheets

SUPERSONIC MOLECULAR BEAM ETCHING OF SURFACES

This is a continuation of application Ser. No. 07/786,448, filed Nov. 1, 1991, now U.S. Pat. No. 5,286,331.

BACKGROUND OF THE INVENTION

1. Field of the Invention

The present invention is generally related to the fabrication of integrated electronic circuits by collision free, neutral beam etching and, more particularly, to a method of improving the reactivity between a substrate surface and incoming etchant molecules by delivering the etchant molecules as highly excited neutral molecules or clusters of molecules.

2. Description of the Prior Art

The use of plasma-assisted etching techniques for circuit fabrication has gained increasing popularity in the semiconductor industry during the past 20 years. The primary advantage of plasma-assisted etching over the prior art wet chemical etching techniques is the superior dimensional control. Typically, integrated circuits are fabricated by building up successive layers of materials on a silicon substrate including a top layer of a photoresist. A resist pattern is created by selective exposure of portions of the photoresist to ultraviolet light followed by development. Subsequently, the underlying layers not coated with the photoresist are then etched away by particle beams which can include ion atoms, molecules or some combination thereof.

Fundamental to the accurate replication of the photoresist pattern into the underlying layer are the concepts of anisotropy and selectivity. FIG. 1A shows a structure 7 comprised of substrate 1 coated with a thin insulating layer 2, a polysilicon layer 3 and a photoresist 5. A resist pattern 9 is formed on the polysilicon layer 3 leaving gap 10 through which polysilicon layer 3 can be etched. A selective isotropic etch of gap 10 with little or no etching of the initial resist pattern 9 yields an undercut profile 11. A selective anisotropic etch as shown in FIG. 1B, however, provides an excellent transfer of resist pattern 9 to the polysilicon layer 3 to yield profile 13. FIG. 1C shows the results of a nonselective anisotropic etch. Erosion of the photoresist areas 15 and underlying polysilicon areas 17 has occurred and the etch has extended into area 19 of the insulating layer 2. Conversely, a controlled slope may be prepared by utilizing a selective anisotropic etch as shown in FIG. 1D. The initial resist pattern 5 is etched to create a slope on edge 21, which is then extended along edge 23 when polysilicon layer 3 is etched.

Generally, gas etching processes require a trade-off between anisotropy, selectivity and etch rate. Anisotropy as produced by positive ion bombardment can be achieved by three mechanisms: ions can sputter adsorbed reaction products from the surface, ions can produce lattice damage thereby creating more active sites for reaction, or ion bombardment can remove an adsorbed layer that inhibits etching by reacting with the etchant or inhibiting access to the surface by the etchant. In all three mechanisms, the ions are directed perpendicular to the surface and result in an anisotropic etch.

In one prior art method known as reactive ion etching (RIE), an anisotropic etch is accomplished by immersing the surface to be treated in a plasma consisting of chemically reactive radicals and ions from a parent gas. RIE has the advantage of being easily interfaced to multichamber integrated processing tools designed to minimize contamination, but high energy ions and photons in the plasma can damage the silicon lattice or thin oxide layers and fluorine in the plasma can etch silicon as well as silicon dioxide. Moreover, because the relative amounts of ions and radicals cannot be independently controlled, it is necessary to operate at a low pressure and low concentration of reactive species, which substantially reduces the etch rate.

In a second well-known method known as ion beam assisted etching (IBAE), etch rate is improved by the addition of a reactive beam consisting of reactive molecules such as $Cl_2$ or $NF_3$ to an ion beam which is directed at the surface to be treated. However, to accommodate both beams, the ion beam is typically directed perpendicular to the wafer surface while the reactive beam is applied at an angle to the wafer surface. Because of its angle, the reactive beam causes the undesirable effects of under-etching and undercutting.

U.S. Pat. No. 4,734,158 to Gillis discloses a method which attempts to overcome the problems associated with IBAE by generating the ion beam separate from the radical beam. The radical beam is directed perpendicular to the wafer surface, while the ion beam is initially generated at an angle to the substrate surface but then deflected so that it strikes the substrate generally coaxially with the radical beam. However, this method is somewhat complex because it requires individual control of the substrate movement and beam intensities.

U.S. Pat. No. 4,937,094 to Doehler et al. discloses a method of generating a high flux of activated species from an energy transferring gas. The method includes introducing an energy transferring gas into an enclosure, which is maintained at a subatmospheric pressure, through at least one aperture formed in a conduit. The flow of gas through this conduit is increased to a substantially transonic velocity and radio frequency (RF) or microwave frequency energy is utilized to activate the gas. The resulting plume of activated species of the energy transferring gas is then directed toward a substrate surface. The result is either deposition or etching of the surface.

SUMMARY OF THE INVENTION

It is therefore an object of the present invention to provide a method for etching microelectronic materials with improved anisotropy, selectivity, surface purity, damage free surfaces and controllability.

According to the invention, neutral molecules of precursor gases are introduced into a small volume combustion chamber where they react to produce etchant molecules with high internal energies. Within the combustion chamber, the etchant molecules form clusters of molecules where the clusters can comprise both etchant molecules and unreacted neutral molecules of the precursor gases. The etchant molecules or clusters of molecules are then expanded through a small nozzle into a vacuum to form a supersonic molecular beam which reacts with a substrate surface. The high intensity supersonic beam and the use of an ultra high vacuum (UHV) wafer chamber to produce low background pressure allow for high purity processing with improved selectivity, surface purity, anisotropy and controllability.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1A:
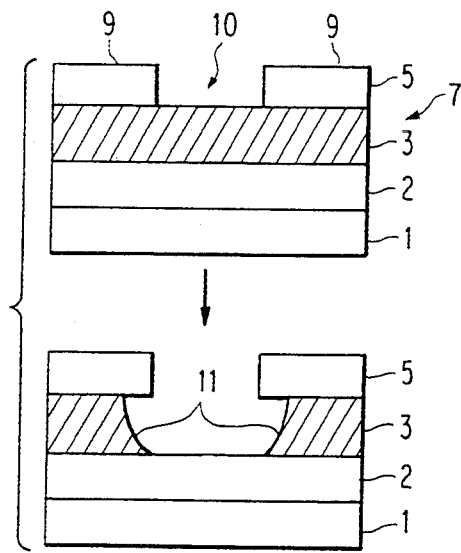
FIG. 1A are sequential cross-sectional side views of a semiconductor wafer during selective isotropic etching.
Figure 1B:
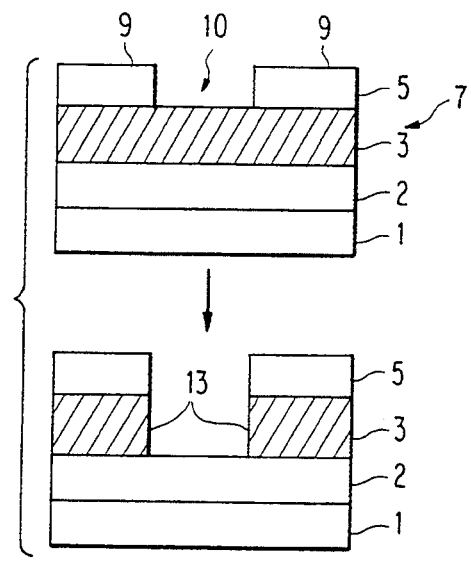
FIG. 1B are sequential cross-sectional side views of a semiconductor wafer during selective anisotropic etching.
Figure 1C:
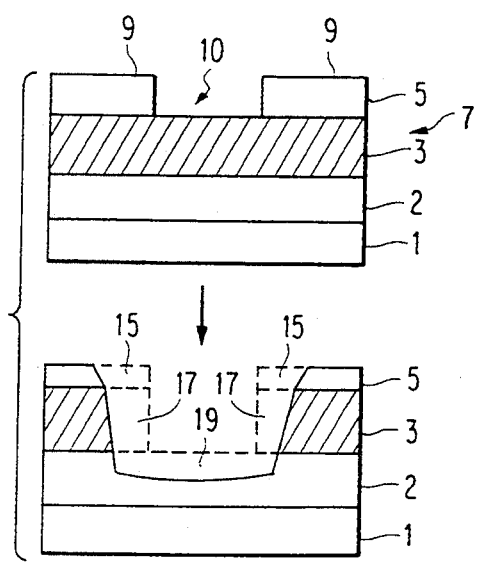
FIG. 1C are sequential cross-sectional side views of a semiconductor wafer during nonselective anisotropic etching.
Figure 1D:
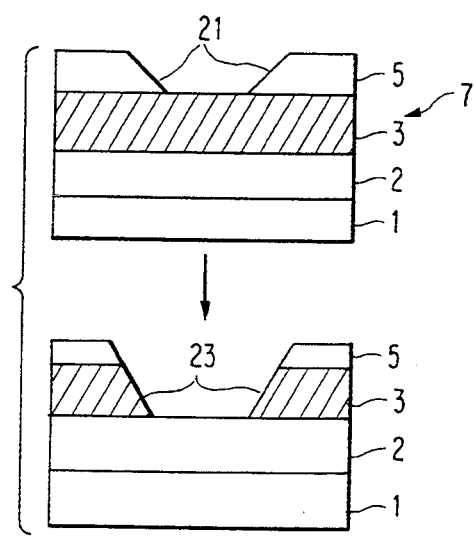
FIG. 1D are sequential cross-sectional side views of a semiconductor wafer during selective anisotropic etching.
Figure 2:
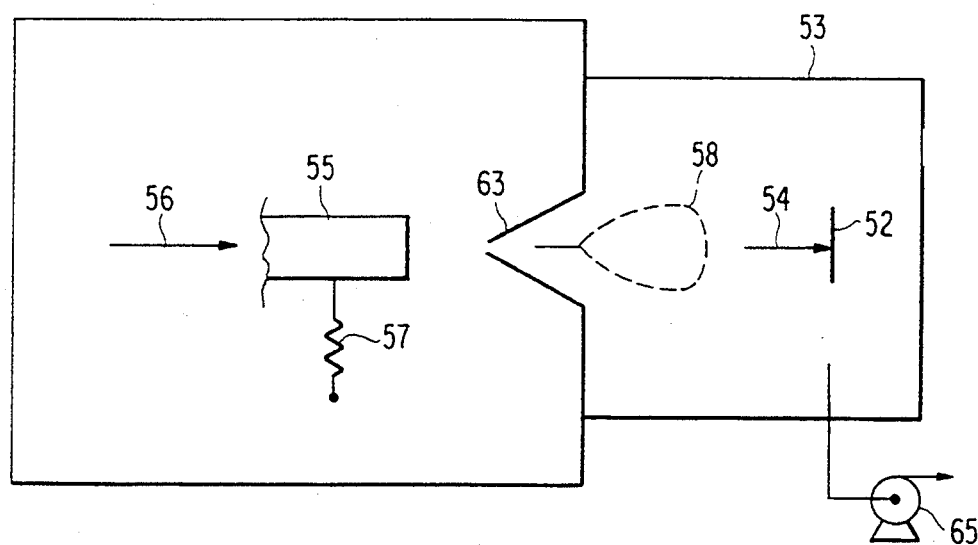
FIG. 2 is a cross-sectional side view of a molecular beam etching apparatus.

Referring now to the drawings, and more particularly to FIG. 2, an apparatus for producing a supersonic molecular beam is shown. Semiconductor wafers 52 to be treated by the process of the present invention are placed within an expansion chamber 53, which is enclosed and maintained at a subatmospheric background pressure. A pump 65 is located outside the chamber 53 to create a vacuum in the chamber 53 and to remove the reaction products produced during the etching process. A nozzle assembly 55 is used to introduce a flow of neutral gaseous molecules into the chamber 53. The gaseous molecules are introduced at a high pressure into at least one conduit 56 of nozzle assembly 55 and released into chamber 53 through a small aperture in the skimmer 63. The intensity 58 of the stream of molecules may be optimized by adjusting the distance between the nozzle 55 and a skimmer 63. The rapid change in pressure from the nozzle assembly 55 to chamber 53 causes the molecules to adiabatically expand. The expansion cools the molecules to a temperature of a few degrees Kelvin. During this expansion/cooling process, the internal energies of the molecules and the pressure-volume work transform into the translational energy of the stream of the molecules which in turn produces a supersonic molecular beam 54. Depending on the number of degrees of freedom of the molecules, the directional stream energy has an approximate range from 0.3 eV to 0.05 eV (3000° K. to 500° K.) and an intensity of $10^{-4}$ to $10^{-6}$ torr beam pressure. These ranges suggest a highly directional beam which provides an intensity that is 2 to 3 orders of magnitude higher than the conventional collimated effusive beam.

Figure 3:
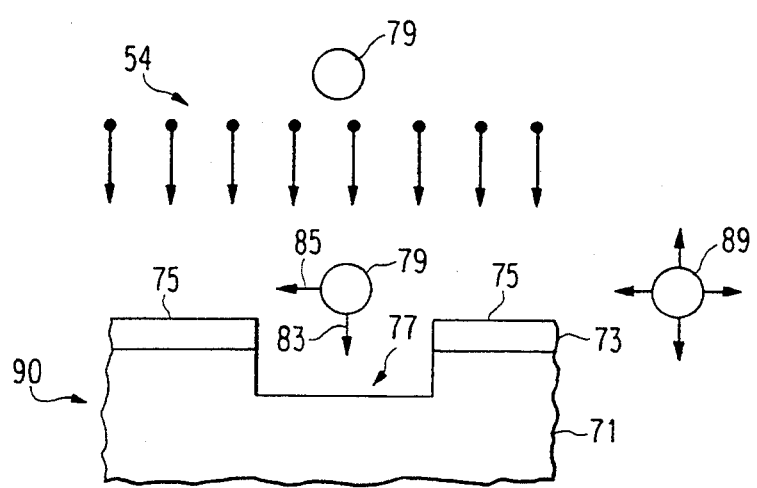
FIG. 3 is a cross-sectional side view of a semiconductor wafer during supersonic molecular beam etching.

FIG. 3 shows a simple illustration of a semiconductor wafer being patterned by a supersonic molecular beam 54 in accordance with the method of the present invention. A semiconductor wafer 90 is formed by layering a substrate 71 with various materials and coating with a top layer of a photoresist material 73. A resist pattern 75 is formed according to conventional methods. The semiconductor is placed in the expansion chamber 53 of FIG. 2 in the path of the beam 54. The beam 54 is comprised of a highly directional and intense stream of molecules, represented by a molecule 79, which is impinged on a surface 77. The molecule 79 is given a perpendicular velocity component 83 associated with the elevated stream energy of the beam and a low parallel velocity component 85. A second molecule 89 represents the background molecules which consist of the etch product and a small amount of the unreacted etchant, which will be removed from the chamber 53 by the pump 65. This invention provides methods of etching which allow a high degree of control over the amount of etching which occurs (e.g., due to the ability to adjust and control reactant fluxes over several orders of magnitude, it is possible to etch 20 Å of a 100 Å layer).

The highly directional beam 54 and UHV processing environment in the chamber 53 can assure surface purity and anisotropic etching as long as the reactivity and the sticking coefficient of the incident molecules are high and the surface diffusion of the adsorbed molecules is small prior to reaction with the wafer surface. Adjustment of the incident beam energy can optimize the sticking, reactivity and mobility of the incident molecules. For example, the translational energy of the incident molecules can be raised by seeding the beam with a light inert gas such as He or lowered by seeding with Kr or Xe in order to increase the probability of adsorption on a surface. Seeding is a process in which a gas, having either lighter or heavier molecules than the etchant gas is mixed together with the etchant gas to adjust the average weight of the incident molecules, which, in turn, has an effect upon the energy of the incident molecules. When lighter seeding molecules are used, the average weight of the molecules in the gas decreases and the acceleration of the beam toward the substrate surface is increased. The reverse is true when heavier seeding molecules are used. Thus, the translational energy of the incident molecules is easily adjusted by the seeding process. The beam energy is readily controlled by adjusting the nozzle temperature via a heating element 57. Provision of a heating element 57 may also aid in the passage of a condensable species produced in a chemical reaction in the nozzle 55.

Figure 4:
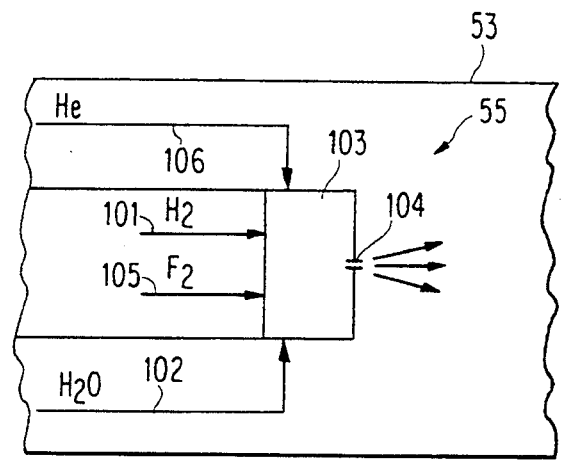
FIG. 4 is a cross-sectional side view of a molecular beam etching apparatus being used to create high energy HF molecules.

In a preferred embodiment, $SiO_2$ surfaces are etched using the supersonic molecular expansion of HF alone or in combination with one or more of the following: $H_2O$, $NH_3$, He, Ar, Kr or Xe. FIG. 4 shows the reaction of high pressure $H_2$ and $F_2$ to form a supersonic molecular beam of HF. The precursor gases, $H_2$ and $F_2$, are introduced into a small volume combustion chamber 103 located in a vacuum expansion chamber 53 via conduits 101 and 105, respectively, and reacted to form etchant molecules. The initial reaction is:

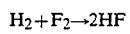

$$H_2 + F_2 \rightarrow 2HF$$

The reaction of the gases in the combustion chamber 53 creates high energy HF molecules having high level rotational and vibrational modes which are generally not relaxed when the gas is released through a nozzle 104 to form a supersonic molecular beam. The HF molecules may be delivered as clusters of molecules which may include HF molecules alone or in combination with unreacted $H_2$ and $F_2$ molecules. The speed of the HF molecules or clusters of molecules out of the nozzle 104 can be regulated by seeding with an inert gas such as He, Ar, Kr, or Xe, as described above.

In the initial stage of the reaction with the substrate, the SiO$_2$ surface is clean so that only chemisorption (sticking) and physisorption of HF can occur. However, once the reaction has commenced, adsorbed water is generated as an etch product according to the following reaction:

$$4HF + SiO_2 \rightarrow SiF_4 + 2H_2O$$

Water enhances the chemisorption and reactivity of the incident HF molecules. Because the optimized parameters at the initial stage of the reaction may differ from those when the adsorbed water is present, the SiO$_2$ temperature can be optimized by pretreating the SiO$_2$ surface with a sufficient amount of water such that H$_2$O desorption is prevented. SiF$_4$ can be desorbed efficiently, and the reaction rate of the adsorbed HF with the SiO$_2$ substrate is high. Pretreating the SiO$_2$ surface with water also eases the initiation of the reaction. Water pretreatment may be accomplished by dosing the clean SiO$_2$ surface with a second molecular beam of H$_2$O vapor which is introduced into the nozzle 103 through a conduit 102 and expanded with an inert seeding gas, such as He, entering the nozzle 103 from another conduit 106 to create a monolayer or layers of water. Alternatively, the H$_2$O vapor may be introduced into the combustion chamber 53 with the HF gas. The H$_2$O and HF molecules are then mixed with the inert seeding gas and coexpanded through the nozzle 104.

Figure 5:
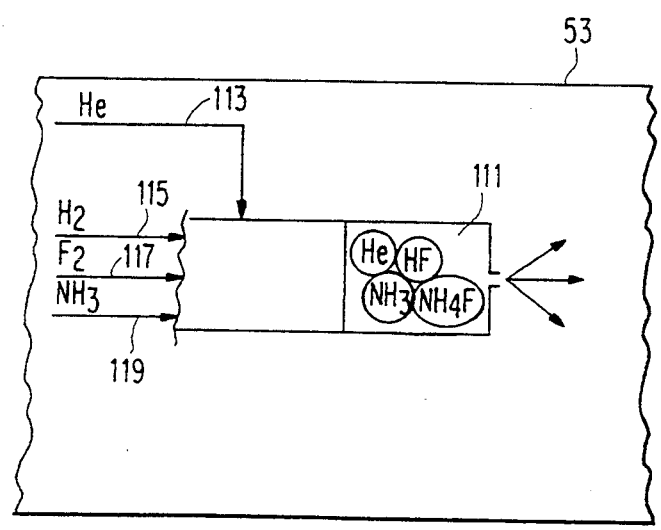
FIG. 5 is a cross-sectional side view of a molecular beam etching apparatus being used to create clusters of etchant molecules.

In a second preferred embodiment, shown in FIG. 5, a beam of NH$_4$F and its cluster 111 is formed by either separately expanding or coexpanding etchant molecules, HF and NH$_3$, with a seeding gas. The precursor gases are introduced through conduits 113, 115, 117 and 119. Preferably, the seeding gas is He which has desirable cooling properties. The cluster 111 is made up of NH$_3$, HF, NH$_4$F and the seeding gas molecules held together by hydrogen bonds. The cluster can reach an even higher directional stream energy than the individual NH$_3$ and HF molecules, because the energy of the resultant species will be relatively equal to the sum of the energies of the individual molecules of the cluster. Therefore, the reactivity and/or sticking coefficient between the substrate and reactive fragments of the cluster will be enhanced. In addition, the simultaneous presence of two different reactants, reactant and catalyst molecules or molecules of the same reactant could provide an improved reaction time between the incident molecules and the substrate surface, because many molecules are delivered simultaneously by the cluster. Furthermore, any reaction requiring the presence of two reactive species or which would be facilitated by their presence would be promoted by delivery of these species as a cluster. When delivered in cluster form, the simultaneous presence of both species is guaranteed.

While the processes of the present invention are described by reference to the apparatus and method of FIGS. 2-5, those skilled in the art will recognize that the invention may be practiced within the spirit and scope of the appended claims.

Having thus described our invention, what we claim as new and desire to secure by Letters Patent is as follows:

1. A method of etching a structure with a supersonic molecular beam, comprising the steps of:

generating a supersonic molecular beam by expanding energetic reactant molecules through a nozzle into a vacuum;

creating said energetic reactant molecules at said nozzle by mixing and reacting individually stable precursor gases; and directing said supersonic molecular beam onto a substrate.

2. A method as recited in claim 1 further comprising the step of seeding said energetic reactant molecules with non-reactive molecules.

3. A method of etching a structure with a supersonic molecular beam, comprising the steps of:

generating a supersonic molecular beam by expanding reactant molecules through a nozzle into a vacuum;

creating said reactant molecules at said nozzle from precursor gases;

seeding said reactant molecules with non-reactive molecules; and directing said supersonic molecular beam onto a substrate, wherein said non-reactive molecules have a higher molecular weight than said reactant molecules.

4. A method as recited in claim 2 wherein said non-reactive molecules have a lower molecular weight that said energetic reactant molecules.

5. A method as recited in claim 1 further comprising the step of forming clusters of said energetic reactant molecules.

6. A method of etching a structure with a supersonic molecular beam, comprising the steps of:

generating a supersonic molecular beam by expanding reactant molecules through a nozzle into a vacuum;

seeding said reactant molecules with non-reactive molecules; and forming clusters of said reactant molecules with energy controlled by a non-reactive additive; and directing said supersonic molecular beam onto a substrate.

7. A method of etching a structure with a supersonic molecular beam, comprising the steps of:

generating a supersonic molecular beam by expanding reactant molecules through a nozzle into a vacuum;

forming clusters of said reactant molecules;

seeding said reactant molecules with non-reactive molecules; and directing said supersonic molecular beam onto a substrate.

wherein said non-reactive molecules have a higher molecular weight than said reactant molecules in said clusters.

8. A method as recited in claim 6 wherein said non-reactive molecules have a lower molecular weight than said reactant molecules in said clusters.

9. A method of etching a layer on a substrate layer, comprising the steps of:

introducing individually stable precursor gases into a reaction chamber where molecules of said precursor gases react to form an energetic reactant species;

generating a supersonic molecular beam by expanding said energetic reactant species through a nozzle into a vacuum; and directing said supersonic molecular beam onto a portion of said layer on said substrate.

10. The method recited in claim 9, further comprising the steps of:
   introducing a seeding gas into said chamber; and
   expanding molecules of said seeding gas with said energetic species.

11. The method recited in claim 9 wherein said layer on said substrate is silicon dioxide and wherein said precursor gasses are selected from the group consisting of $H_2$, $NH_3$ and $F_2$.

12. The method recited in claim 9 further comprising the step of creating clusters of molecules in said reaction chamber.

13. The method recited in claim 12 wherein said clusters of molecules include said molecules of said energetic reactant species and molecules of said precursor gases, said step of generating said supersonic molecular beam co-expanding said energetic reactant species and said clusters of molecules through said nozzle.

14. A method of etching a layer on a substrate, comprising the steps of:
   forming clusters of etchant molecules in a chamber by mixing at least two gasses which reactively combine with each other;
   generating a supersonic molecular beam by expanding said clusters of etchant molecules through a nozzle into a vacuum; and
   directing said supersonic molecular beam onto a portion of said substrate.

15. The method recited in claim 14, further comprising the steps of:
   introducing a seeding gas into said chamber; and
   expanding molecules of said seeding gas with said clusters of etchant molecules.

16. The method recited in claim 15 wherein said etchant molecules are selected from the group consisting of HF and $NH_4F$.

17. A method according to claim 1, wherein a first of said precursor gases comprises $F_2$.

18. A method according to claim 1, wherein a reaction is formed by an interaction between said energetic reactant molecules devoid of external activation, a product of said reaction being reactive with said substrate.

19. A method according to claim 6, wherein a reaction is formed by an interaction between said reactant molecules devoid of external activation, a product of said reaction being reactive with said substrate.

20. A method according to claim 9, wherein a reaction is formed by an interaction between said energetic reactant species devoid of external activation, a product of said reaction being reactive with said portion of said layer of said substrate.

21. A method according to claim 14, wherein a reaction is formed by an interaction between said etchant molecules devoid of external activation, a product of said reaction being reactive with said substrate.

* * * * *